(12) United States Patent
Pathak et al.

(10) Patent No.: US 6,618,289 B2
(45) Date of Patent: Sep. 9, 2003

(54) HIGH VOLTAGE BIT/COLUMN LATCH FOR VCC OPERATION

(75) Inventors: Saroj Pathak, Los Altos Hills, CA (US); James E. Payne, Boulder Creek, CA (US); Harry H. Kuo, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/039,916

(22) Filed: Oct. 29, 2001

(65) Prior Publication Data

US 2003/0081448 A1 May 1, 2003

(51) Int. Cl.[7] ............................................... G11C 16/06
(52) U.S. Cl. ........................... 365/185.25; 365/185.18; 365/189.05
(58) Field of Search ........................ 365/185.25, 185.18, 365/189.05, 185.01, 189.01

(56) References Cited

U.S. PATENT DOCUMENTS

| | | | |
|---|---|---|---|
| 4,070,590 A | 1/1978 | Ieda et al. ................. 307/355 |
| 4,175,290 A | 11/1979 | Harari ........................ 365/156 |
| 4,887,242 A | 12/1989 | Hashimoto ................ 365/238.5 |
| 4,953,129 A * | 8/1990 | Kobayashi et al. ..... 365/185.25 |
| 5,105,384 A | 4/1992 | Noguchi et al. ............ 365/185 |
| 5,347,487 A | 9/1994 | Dao et al. ................ 365/189.05 |
| 5,521,864 A | 5/1996 | Kobayashi et al. ..... 365/185.22 |
| 5,561,629 A | 10/1996 | Curd ....................... 365/185.21 |
| 5,608,681 A | 3/1997 | Priebe et al. ................. 365/207 |
| 5,764,564 A * | 6/1998 | Frake et al. ................. 365/154 |
| 5,812,463 A | 9/1998 | Park ....................... 365/189.05 |
| 5,828,621 A | 10/1998 | Tanzawa et al. ............ 365/229 |
| 5,831,896 A * | 11/1998 | Lattimore et al. .......... 365/154 |
| 5,986,923 A * | 11/1999 | Zhang et al. ................ 365/154 |
| 6,021,069 A | 2/2000 | Hung et al. ............ 365/185.22 |
| 6,055,659 A | 4/2000 | Whetsel ...................... 714/726 |
| 6,172,917 B1 * | 1/2001 | Kataoka et al. ......... 365/189.05 |

* cited by examiner

Primary Examiner—Hoai Ho
(74) Attorney, Agent, or Firm—Thomas Schneck

(57) ABSTRACT

A bit/column latch comprising a pair of first and second cross-coupled CMOS inverters. Each inverter of the pair comprises an NMOS transistor and a PMOS transistor. The first CMOS inverter has the source of its NMOS transistor coupled to ground via a control transistor and has its output connected to the associated bit line. When low voltage data intended for the associated memory cell appears on the bit line, the control transistor is barely turned on to weaken the NMOS transistor of the first inverter. This makes it easier for the data on the bit line to turn on the NMOS transistor of the second inverter so as to switch the bit latch from storing a 'low' to storing a 'high'. In other words, the data bit from the bit line is loaded into the bit latch. After that, the control transistor is strongly turned on and therefore it becomes transparent to the latch. As a result, the latch is stable when the bit line later ramps up to a high programming level.

21 Claims, 3 Drawing Sheets

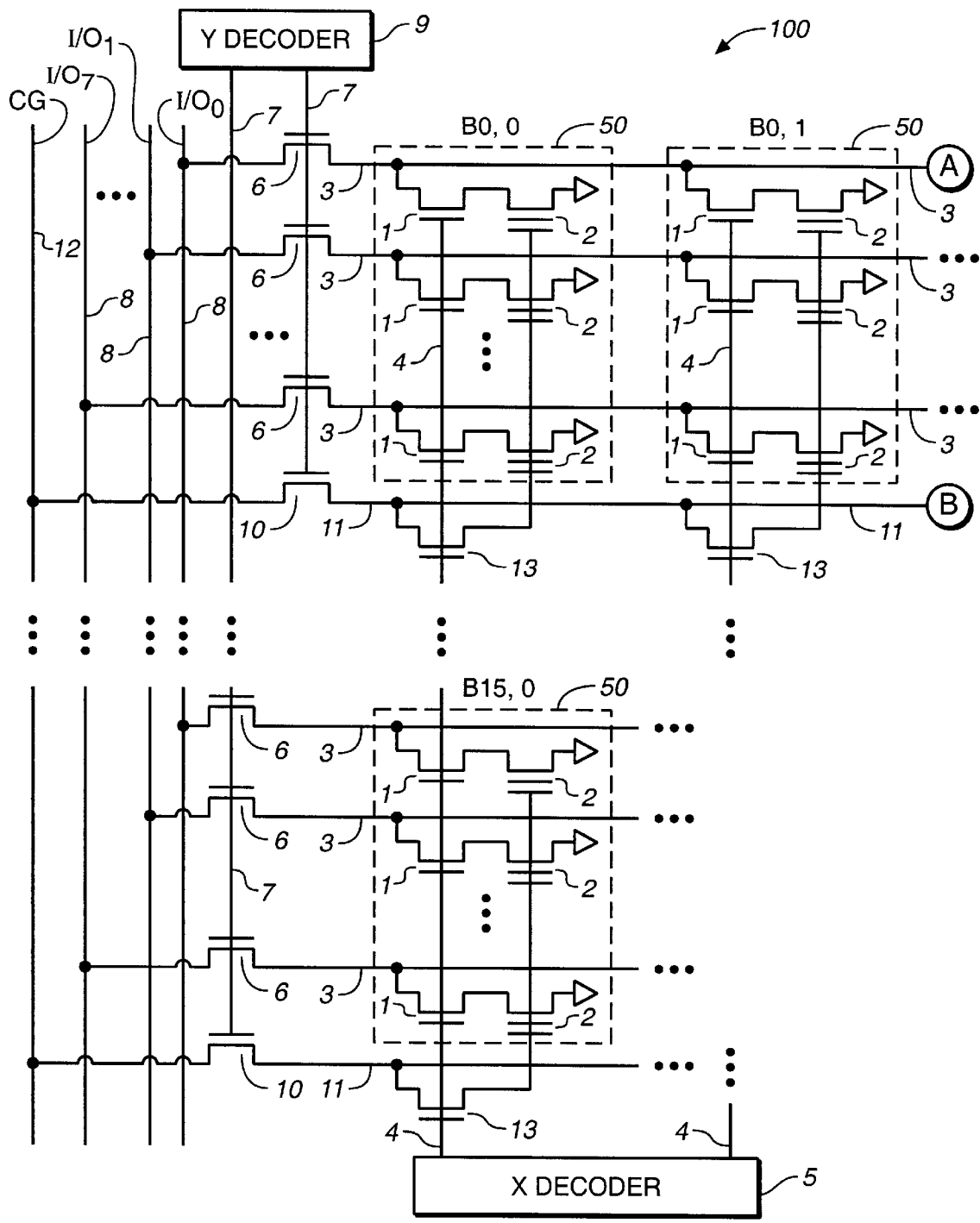
FIG._1A *(PRIOR ART)*

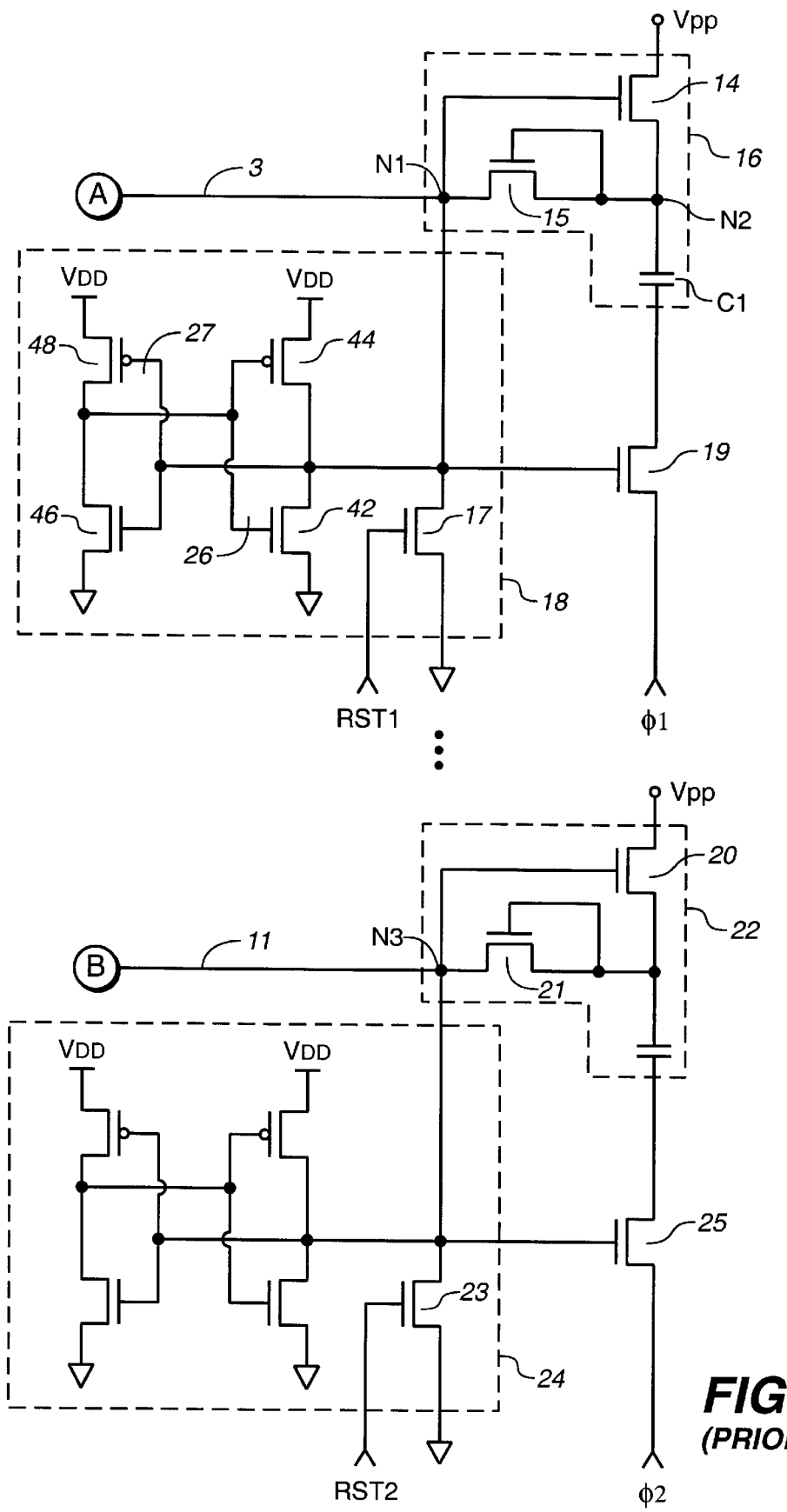
FIG._1B (PRIOR ART)

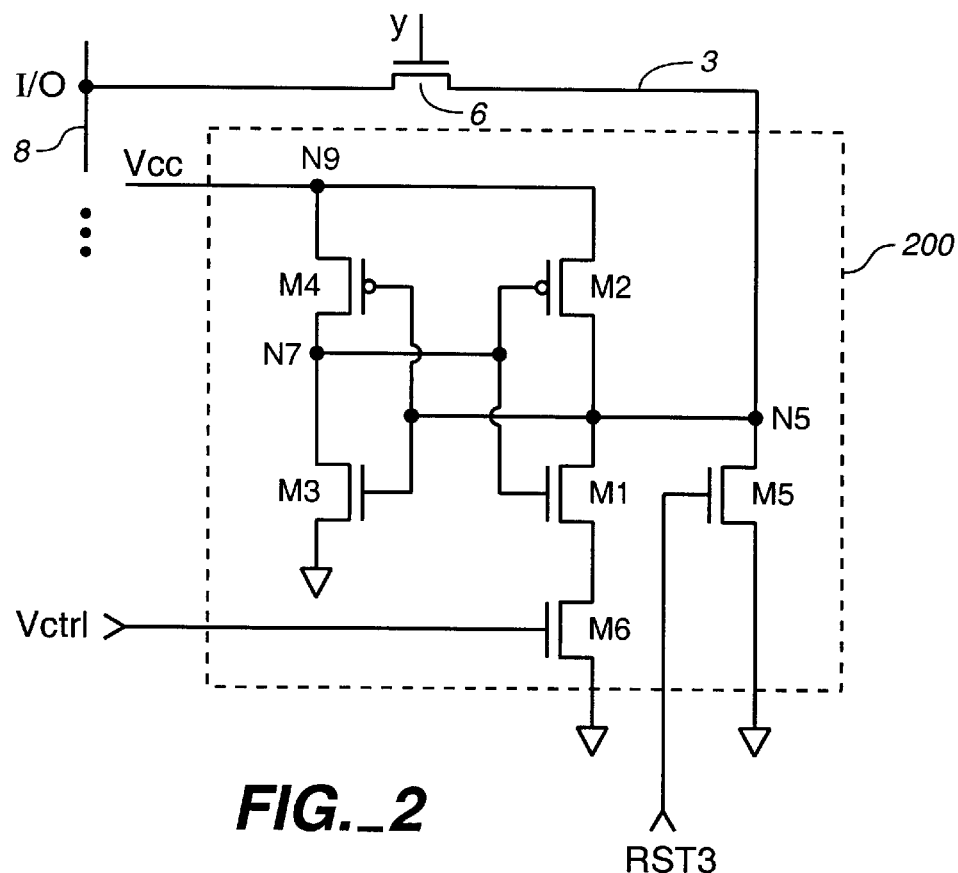
FIG._2
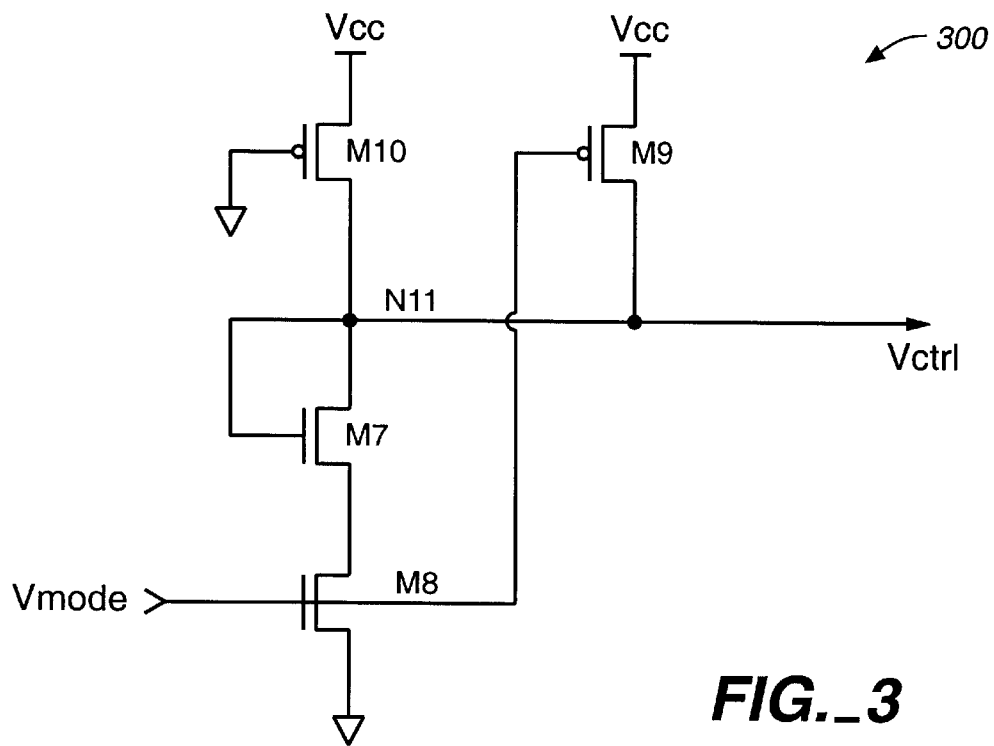
FIG._3

HIGH VOLTAGE BIT/COLUMN LATCH FOR VCC OPERATION

TECHNICAL FIELD

The invention relates to bit/column latches, and more particularly to a bit latch that can operate at a low Vcc.

BACKGROUND ART

FIGS. 1A & 1B show a circuit diagram of a typical 64K bit EEPROM 100 (Electrically Erasable Programmable Read Only Memory) of prior art. EEPROM 100 comprises an array of memory blocks 50. Each memory blocks 50 has 8 memory cells 1,2. Each memory cell 1,2 has a select transistor 1 and a memory transistor 2. Each select transistor 1 has its drain connected to a bit line 3, its gate connected to word line 4, and its source connected to the drain of a memory transistor 2 in the same memory cell 1,2. Each memory transistor 2 has its source grounded, its drain connected to the source of a select transistor 1 in the same memory cell 1,2, and its gate connected to an erase transistor 13. There is an erase transistor 13 associated with each memory block 50. Each erase transistor 13 has its drain connected to a control gate line 11, its source connected to the control gates of the eight memory transistors 2 of the associated memory block 50, and its gate connected to a word line 4. Each bit line 3 connects, at one end, to a high voltage charge pump 16 and a bit latch 18, and at the other end to an I/O line of data bus 8 via a Y-transistor 6. The gate of each Y-transistor 6 is connected to a Y-decoder 9 via a Y gate line 7. Y decoder 9 selects only one Y gate line 7 at a time. Each control gate line 11 connects, at one end, to a high voltage charge pump 22 and a bit latch 24, and at the other end to a control gate (CG) line 12 via a Y-transistor 10.

The programming (writing) operation of EEPROM 100 is carried out in a page mode in which 16 memory blocks 50 on a same word line 4 are programmed simultaneously. Programming cycle starts with CG line 12 being raised to Vcc (5V) and the program data intended for a memory block 50 (say, B0,0) appearing on eight lines of data bus 8. Y decoder 9 should select the rightmost Y gate line 7 because data on data bus 8 is intended for memory block B0,0. As a result, all eight Y transistors 6 corresponding to the first row of memory blocks 50 (i.e., B0,0; B0,1; . . . ) are ON passing the data intended for memory block B0,0 along eight bit lines 3 into eight bit latches 18 in FIG. 1B. FIG. 1B shows only the top one of the eight bit latches 18 corresponding to the first row of memory blocks 50.

Similarly, Y transistors 10 corresponding to the first row of memory blocks 50 (i.e., B0,0; B0,1; . . . ) are ON passing a high signal (Vcc) from CG line 12 along control gate line 11 into bit latch 24 in FIG. 1B corresponding to the first row of memory blocks 50. Each of bit latches 18 and 24 comprises a pair of cross-coupled CMOS inverters and a reset transistor.

Next, the same process occurs for memory block B1,0 (not shown). That is, CG line 12 is high (Vcc). Data intended for memory block B1,0 appears on data bus 8. Y decoder 9 selects the Y gate line 7 corresponding to the second row of memory blocks 50 to which memory block B1,0 belongs. As a result, all eight Y transistors 6 corresponding to the second row of memory blocks 50 (i.e., B1,0; B1,1; . . . ) are ON passing the data intended for memory block B1,0 along eight bit lines 3 into eight bit latches 18 (not shown) corresponding to the second row of memory blocks 50.

Similarly, Y transistors 10 corresponding to the second row of memory blocks 50 (i.e., B1,0; B1,1; . . . ) are ON passing a high signal (Vcc) from CG line 12 along control gate line 11 into bit latch 24 (not shown) corresponding to the second row of memory blocks 50. The same latching process occurs for other 14 rows such that data intended for 16 memory blocks B0,0; B1,0; B2,0; . . . and B15,0 are stored in 128 bit latches 18.

Next, simultaneously, all 16 high voltage charge pumps 22 corresponding to 16 rows of memory blocks 50 raise the potentials of the associated control gate lines 11 to an erasing level (20V). In the mean time, X decoder 5 selects the word line 4 corresponding to memory blocks B0,0; B10; B2,0; . . . ; and B15,0. As a result, all 128 memory cells 1,2 of the 16 memory blocks 50 are simultaneously erased.

Then, actual programming is simultaneously carried out for all 128 memory cells 1,2 of the 16 memory blocks B0,0; B1,0; B2,0; . . . ; and B15,0. Considering the top memory cell 1,2 of memory block B0,0, if its associated bit latch 18 stores a 'high', that is NMOS transistors 42 and PMOS transistor 48 are OFF, and NMOS transistors 46 and PMOS transistor 44 are ON, then node N1 has a high potential (Vcc), and transistor 19 is ON. As a result, the associated high voltage charge pump 16 operates to raise node N1 to a programming level (20V) thereby programming the top memory cell 1,2 of memory block B0,0.

On the other hand, if the bit latch 18 associated with the top memory cell 1,2 of memory block B0,0 stores a 'low', that is NMOS transistors 42 and PMOS transistor 48 are ON, and NMOS transistors 46 and PMOS transistor 44 are OFF, then node N1 has a low potential (0V), and transistor 19 is OFF. As a result, the associated high voltage charge pump 16 does not operate and the top memory cell 1,2 of memory block B0,0 remains being erased. The other 127 memory cells 1,2 of the memory page including a first column of 16 memory blocks 50 are programmed in the same manner and at the same time.

After that, the second page including 16 memory blocks B0,1; B1,1; . . . ; and B15,1 is programmed in the same manner as the first page. As the size of memory cells decreases, the operating voltage for the memory circuits also decreases. As the operating voltage is reduced below 2V, some operating problems develop. For example, assuming 1.4V and 0V represent a 'high' and 'low', respectively, on data bus 8, then EEPROM 100 may not operate correctly. With a threshold voltage drop of 0.7V across Y transistors 6, a 'high' of bit line 3 results in a voltage of 0.7V (1.4V−0.7V). This may not be high enough to switch the state of the associated bit latch 18.

For instance, consider the bit latch 18 associated with the top memory cell 1,2 in FIGS. 1A & 1B. Initially, the bit latch 18 is reset by turning ON reset transistor 17. As a result, bit latch 18 stores a 'low', meaning NMOS transistors 42 and PMOS transistor 48 are ON, and NMOS transistors 46 and PMOS transistor 44 are OFF. With only 1.4V on an I/O line 8, it is difficult to overcome strongly conducting NMOS 42 to raise the potential of bit line 3 high enough to turn on NMOS transistor 46 so as to switch the state of bit latch 18 (making it store a 'high'). Using a weak NMOS 42 would help make it easier to switch the state of bit latch 18 to 'high' but would result in bit latch 18 being unstable when bit line 3 later rises to the programming level (20V).

Therefore, it is an object of the present invention to introduce a bit latch that can be easily switched to 'high' but is still stable when bit line 3 later rises to the programming level (20V).

DISCLOSURE OF THE INVENTION

The present invention achieves the stated object by using a bit latch having a control transistor in series with the two transistors 44 and 42 of inverter 26 in FIG. 1B. When a 'high' needs to be stored in latch 18, the control transistor is turned on barely to weaken NMOS transistor 42. As a result, a 'high' data bit on bit line 3 can more easily turn on NMOS transistor 46 of inverter 27 triggering the switch in state of bit latch 18 to 'high'. After that, the control transistor is strongly turned on and therefore it becomes transparent to the latch. As a result, the latch is stable when the bit line later ramps up to the high programming level.

BRIEF DESCRIPTION OF THE DRAWINGS

FIGS. 1A & 1B is a circuit digram of a typical EEPROM of prior art.

FIG. 2 is a circuit digram of the bit latch of the present invention.

FIG. 3 is a circuit digram of a circuit for generating the control signal Vctrl for the bit latch of FIG. 2.

BEST MODE FOR CARRYING OUT THE INVENTION

With reference to FIG. 2, a bit latch 200 according to the present invention comprises a pair of cross-coupled CMOS inverters. Specifically, NMOS transistor M1 and PMOS transistor M2 form a first CMOS inverter M1,M2. NMOS transistor M3 and PMOS transistor M4 form a second CMOS inverter M3,M4. The output of first inverter M1,M2, i.e., node N5, is connected to the input of second inverter M3,M4. The output of second inverter M3,M4, i.e., node N7, is connected to the input of first inverter M1,M2. The sources of PMOS transistors M2 & M4 are connected to a node N9 which is tied to the operating voltage Vcc. Bit latch 200 can have two stable states. In a first stable state, bit latch 200 stores a 'low', that is, transistors M1 and M4 are ON, and transistors M2 and M3 are OFF. In a second stable state, bit latch 200 stores a 'high', that is, transistors M1 and M4 are OFF, and transistors M2 and M3 are ON. CMOS inverters M1,M2 and M3,M4 are used for illustration. In fact, other kinds of inverters can be used. For example, PMOS transistor M2 of CMOS inverter M1,M2 can be replaced by a load resistor, a depletion load transistor, etc. (not shown). Similarly, PMOS transistor M4 of CMOS inverter M3,M4 can be replaced by a load resistor, a depletion load transistor, etc. (not shown).

The source of transistor M1 is connected to the drain of a control transistor M6. Control transistor M6 has its gate receiving a control signal Vctrl and its source connected to ground. Control transistor M6 in FIG. 2 is an NMOS transistor. However, any other control circuit can be used to couple the source of transistor M1 to ground such that when bit latch 200 needs to be switched to 'high', the control circuit must operate as a resistance so as to weaken transistor M1 and thereby make it easier for turning on NMOS transistor M3. In other words, the control circuit operates to weaken inverter M1,M2, so that a data bit 'high' on bit line 3 intended for the associated memory cell 1,2 can switch the state of inverter M3,M4. This in turn switches the state of inverter M1,M2. As a result, bit latch 200 switches its state from 'low' to 'high'.

Bit latch 200 also comprises a reset transistor MS having its gate receiving a reset signal RST3, its drain connected to node N5, the output of first inverter M1,M2, and its source grounded. Node N5 is connected to a bit line 3 which in turn connects to an I/O line 8 via a Y transistor 6.

Bit latch 200 is designed to operate at Vcc as low as 1.4V. Bit latch 200 operates as follows. Programming cycle starts with reset transistor MS being turned on by reset signal RST3 being high (1.4V, i.e., Vcc). As a result, node N5 is pulled to ground. At this time, control signal Vctrl is high (Vcc); therefore, control transistor M6 is ON and transparent (as if it were a piece of wire) to bit latch 200. Reset transistor MS is designed to be stronger than PMOS transistor M2; therefore, when reset transistor MS is ON, it pulls node N5 low enough to turn on PMOS transistor M4, thereby, making bit latch 200 store a 'low' (reset). Specifically, bit latch 200 storing a 'low' (reset) means NMOS transistor M1 and PMOS transistor M4 are ON; and NMOS transistor M3 and PMOS transistor M2 are OFF.

Next, write data intended for the associated memory cell (not shown) appears on I/O line 8 and at the same time Y transistor 6 is turned on passing that write data along bit line 3 into bit latch 200 via node N5. At this time, control transistor M6 is barely turned on to operate as a big (high resistance) resistor between transistor M1 and ground. The phrase "barely turned on" refers to a state of control transistor in which the gate of control transistor M6 is at a threshold voltage. If the voltage at the gate of control transistor M6 falls below the threshold voltage, control transistor M6 is turned off (non-conducting). If the voltage at the gate of control transistor M6 rises above the threshold voltage, control transistor M6 becomes more ON (more conducting). In other words, when the gate of control transistor M6 rises from zero, at some point, control transistor M6 changes from OFF to ON. At that point, control transistor M6 is said to be barely turned on.

If the data to be programmed into the associated memory cell 1,2 (not shown) is a 'low', that is I/O bus 8 is at 0V, then there is not a problem because bit latch 200 after being reset already stores a 'low'.

If the data to be programmed into the associated memory cell 1,2 (not shown) is a 'high', that is I/O bus 8 is at 1.4V, this 'high' data signal drives up the potential at node N5 to at most 0.7V (1.4V−Vt). Because transistor M1 is weakened in pulling down the potential at node N5, the potential at node N5 is close to 0.7V which is high enough to turn on transistor M3. As a result, the potential at node N7 drops and this turns off transistor M1 and turns on transistor M2. Node N5 is pulled up to Vcc (1.4V). Transistor M3 turns on strongly, and transistor M4 turns off. In other words, bit latch 200 switches to storing a 'high'.

After the data intended for the associated memory cell 1,2 (not shown) is stored in bit latch 200, a charge pump will be used to raise the potential of bit line 3 to a programming voltage (20V) if bit latch 200 stores a 'high'. If bit latch 200 stores a 'low', the charge pump is disabled. Charge pump 16 and enable transistor 19 in FIG. 1B can be interfaced with bit latch 200 of FIG. 2 to carry out this function. The interface (not shown) should be similar to that between charge pump 16, enable transistor 19, and bit latch 18 of FIG. 1B. In the mean time, control transistor M6 is turned on strongly to keep bit latch 200 stable while the potential of node N5 ramps up to the programming level (20V).

Alternatively, a charge pump can be used to raise the potential of node N9 from Vcc to the programming level if bit latch 200 stores a 'high'. In this case, similarly, control transistor M6 is strongly turned on to keep bit latch 200 stable while the potential of node N9 ramps up from Vcc (1.4V) to the programming level (20V). As node N9 rises to 20V, node N5 follows node N9 in voltage if bit latch 200 stores a 'high'. In other words, the potential of bit line 3 rises to the programming voltage if bit latch 200 stores a 'high'.

With reference to FIG. 3, a circuit 300 that can be used to generate control signal Vctrl is shown. Circuit 300 comprises a switch transistor M8 having its source connected to ground, its gate connected to a mode signal Vmode, and its drain connected to a mirror transistor M7. Mirror transistor M7 has its gate and drain tied to a node N11. Mirror transistor M7 is the same as control transistor M6 (FIG. 2). Node N11 is connected to Vcc via a load PMOS transistor M10. Circuit 300 also comprises a pull-up PMOS transistor M9 having its gate connected to the gate of transistor M8, its drain connected to node N11, and its source connected to Vcc. Node N11 is connected to the gate of control transistor M6 (FIG. 2), thereby providing control signal Vctrl to control the operation of control transistor M6 (FIG. 2).

Circuit 300 operates as follows. Initially, mode signal Vmode is low (0V). Switch transistor M8 is OFF and pull-up transistor M9 is ON. As a result, Vctrl is high (Vcc), and control transistor M6 (FIG. 2) is strongly ON and is transparent to bit latch 200 (FIG. 2).

When data intended for the associated memory cell (not shown) appears on I/O bus 8 (FIG. 2), Vmode rises to high (Vcc) turning on mode transistor M8 and turning off pull-up transistor M9. As a result, mirror transistor M7 starts operating as a diode and the potential at node N11 is Vt (threshold voltage of mirror transistor M7). Because mirror transistor M7 and control transistor M6 (FIG. 2) are the same, their threshold voltages are also the same, and therefore, the potential Vt at node N11 barely turns on control transistor M6 (FIG. 2). At this moment, control transistor M6 (FIG. 2) plays the role of a big resistor weakening transistor M1 (FIG. 2).

When data on I/O bus 8 (FIG. 2) has been successfully stored in bit latch 200 (FIG. 2), Vmode falls to ground turning off mode transistor M8 and turning on pull-up transistor M9. As a result, Vctrl rises to high, turning control transistor M6 on strongly. This strengthens inverter M1,M2 in retaining its state because control transistor M6 and inverter M1,M2 are in series between node N9 and ground. This helps keep bit latch 200 (FIG. 6) stable when bit line 3 (FIG. 2) ramps up to the programming voltage (20V). After that, mode signal Vmode stays low until the next programming cycle.

What is claimed is:

1. A bit latch operating at a low operating voltage for storing a data bit intended for a memory cell, said bit latch comprising:

a pair of first and second cross-coupled inverters, said first inverter having a first output node and a first input node, said second inverter having a second output node and a second input node, said first input node being connected to said second output node, said second input node being connected to said first output node, said first output node of said first inverter being connected to a bit line, said first inverter having a third terminal;

a reset circuit means coupled to said first output node for resetting said first inverter and said second inverter;

a control circuit coupled to said third terminal of said first inverter; and means for generating an analog control signal applied to said control circuit, said means for generating having a switch transistor and a mirror transistor so that whenever said switch transistor is ON responsive to a mode signal on its gate indicative of the presence of a data bit on said bit line, said mirror transistor operates as a diode, producing a threshold voltage to barely turn on said control circuit and weakening said first inverter so that said data bit on said bit line cart switch the state of said second inverter, and whenever said switch transistor is OFF in the absence of any data bit on said bit line, said control circuit being fully ON to becoming transparent to said bit latch.

2. The bit latch of claim 1 wherein said first inverter comprises a first transistor, said first transistor having:

a first drain/source connected to said third terminal; and a second drain/source connected to said first output node of said first inverter;

wherein, in response to said data bit appearing on said bit line, said partially ON control circuit operates as a large resistor so as to weaken said first transistor so that said data bit on said bit line can switch the state of said second inverter, and thereby switching the state of said bit latch.

3. The bit latch of claim 1 wherein said first transistor is an NMOS transistor.

4. The bit latch of claim 3 wherein said control circuit comprises a control transistor having:

a third drain/source connected to said third terminal of said first inverter;

a fourth drain/source connected to ground; and a first gate receiving a control signal;

wherein, in response to said data bit appearing on said bit line, said control signal barely turns on said control transistor so as to weaken said first inverter so that said data bit on said bit line can switch the state of said second inverter, and thereby switching the state of said bit latch.

5. The bit latch of claim 4 wherein said control transistor is an NMOS transistor.

6. The bit latch of claim 5 wherein said first and second inverters are CMOS inverters.

7. The bit latch of claim 1 wherein said control circuit comprises a control transistor having:

a first drain/source connected to said third terminal of said first inverter;

a second drain/source connected to ground; and a first gate receiving a control signal;

wherein, in response to said data bit appearing on said bit line, said control signal barely turns on said control transistor so a to weaken said first inverter so that said data bit on said bit line can switch the state of said second inverter, and thereby switching the state of said bit latch.

8. The bit latch of claim 7 wherein said control transistor is an NMOS transistor.

9. The bit latch of claim 8 wherein said first and second inverters are CMOS inverters.

10. The bit latch of claim 1 wherein said means for generating a control signal for said control circuit further comprises:

said switch transistor being an NMOS transistor having a source connected an input mode signal, its drain connected to a mirror transistor, and a gate connected to an electrical ground;

said mirror transistor being an NMOS transistor having a gate and drain tied together;

a PMOS load transistor having a source connected to said gate of said mirror transistor, a gate connected to the electrical ground, and a drain connected to a voltage supply; and a PMOS pull up transistor having a gate connected to the gate to said switch transistor, a drain connected to the supply voltage, and a source connected to the gate of said mirror transistor and forming said control signal.

11. A method of storing a data bit on a bit line into a bit latch, said method comprising the steps of:

providing said bit latch which comprises a pair of first and second cross-coupled inverters, said bit latch having a first and second states, said first inverter having a third and fourth states corresponding to said first and second states of said bit latch, respectively, said second inverter having a fifth and sixth states corresponding to said first and second states of said bit latch, respectively, said first inverter having a first input node and a first output node, said first output node being connected to said bit line, said second inverter having a second input node and a second output node, said second input node being connected to said first output node, said second output node being connected to said first input node;

resetting said bit latch to said first state, whereby said first inverter being reset to said third state, and second inverter being reset to said fifth state;

applying said data bit to said bit line; and weakening said first inverter so that said data bit on said bit line can switch said second inverter from said fifth state to said sixth state, thereby causing said first inverter to switch from said third state to said fourth state, whereby said bit latch switches from said first state to said second state representing the storage of said data bit in said bit latch.

12. The method of claim 11 further comprising the step of strengthening said first inverter after said data bit has been stored in said bit latch, whereby said data bit is firmly stored in said bit latch.

13. The method of claim 12 wherein the step of providing said bit latch comprises the step of providing said first inverter with a first transistor, said first transistor having:

a first source/drain connected to said first output node; and a second source/drain.

14. The method of claim 13 wherein the step of weakening said first inverter comprises the step of providing a high resistance between said second source/drain of said first inverter and ground.

15. The method of claim 14 wherein the step of providing a high resistance comprises the steps of:

providing a control transistor to couple said second source/drain of said first inverter to ground; and barely turning on said control transistor to provide said high resistance between said second source/drain of said first inverter and ground.

16. The method of claim 15 wherein the step of strengthening said first inverter comprises the step of strongly turning on said control transistor to provide a low resistance between said second source/drain of said first inverter and ground, whereby said data bit is firmly stored in said bit latch.

17. The method of claim 15 wherein the step of barely turning on said control transistor comprises the step of using a mirror transistor to generate a control signal to a gate of said control transistor so as to barely turn on said control transistor.

18. The method of claim 11 wherein the step of providing said bit latch comprises the step of providing said first inverter with a first transistor, said first transistor having:

a first source/drain connected to said first output node; and a second source/drain.

19. The method of claim 18 wherein the step of weakening said first inverter comprises the step of providing a high resistance between said second source/drain of said first inverter and ground.

20. The method of claim 19 wherein the step of providing a high resistance comprises the steps of:

providing a control transistor to couple said second source/drain of said first inverter to ground; and barely turning on said control transistor to provide said high resistance between said second source/drain of said first inverter and ground.

21. The method of claim 20 wherein the step of strengthening said first inverter comprises the step of strongly turning on said control transistor to provide a low resistance between said second source/drain of said first inverter and ground, whereby said data bit is firmly stored in said bit latch.

* * * * *